United States Patent [19]
Horak et al.

[11] Patent Number: 6,063,658
[45] Date of Patent: May 16, 2000

[54] METHODS OF MAKING A TRENCH STORAGE DRAM CELL INCLUDING A STEP TRANSFER DEVICE

[75] Inventors: David Vaclav Horak; Toshiharu Furukawa, both of Essex Junction; Steven John Holmes; Mark Charles Hakey, both of Milton, all of Vt.; William Hsioh-Lien Ma, Fishkill; Jack Allan Mandelman, Stormville, both of N.Y.

[73] Assignee: International Business Machines Corporation, Armonk, N.Y.

[21] Appl. No.: 09/172,865

[22] Filed: Oct. 15, 1998

Related U.S. Application Data

[62] Division of application No. 09/014,523, Jan. 28, 1998, Pat. No. 5,831,301.

[51] Int. Cl.[7] .............................................. H01L 21/8242
[52] U.S. Cl. ........................................... 438/248; 438/249
[58] Field of Search .................................... 438/243, 244, 438/246, 247, 248, 249, 386, 387, 391, 392

[56] References Cited

U.S. PATENT DOCUMENTS

| | | | |
|---|---|---|---|
| 4,651,184 | 3/1987 | Malhi | 257/302 |
| 4,833,516 | 5/1989 | Hwang et al. | 257/302 |
| 4,890,145 | 12/1989 | Malhi | 257/302 |
| 5,034,787 | 7/1991 | Dhong et al. | 257/302 |
| 5,064,777 | 11/1991 | Dhong et al. | 438/247 |
| 5,156,992 | 10/1992 | Teng et al. | 438/246 |
| 5,198,383 | 3/1993 | Teng et al. | 438/248 |
| 5,223,447 | 6/1993 | Lee et al. | 438/248 |
| 5,360,758 | 11/1994 | Bronner et al. | 438/243 |
| 5,563,085 | 10/1996 | Kohyama | 438/249 |
| 5,614,431 | 3/1997 | DeBrosse | 438/243 |

OTHER PUBLICATIONS

Nesbit, L., et al., "A 0.6 $\mu m^2$ 256Mb Trench DRAM Cell with Self–Aligned BuriEd Strap (BEST)," IEDM 93, 1993, pp. 627–630.

Bronner, G., et al., "A Fully Planarized 0.25$\mu m$ CMOS Technology for 256Mbit DRAM and Beyond," 1995 Symposium on VLSI Technology Digest of Papers, pp. 15–16.

*Primary Examiner*—Chandra Chaudhari
*Attorney, Agent, or Firm*—Pollock, Vande Sande & Amernick

[57] ABSTRACT

A memory cell including a substrate, at least one deep trench capacitor in the substrate, at least one FET in the substrate disposed over at least a portion of the at least one deep trench capacitor, and at least one isolation region in the substrate surrounding the at least one FET and having a greater depth than the at least one FET. The at least one FET includes a gate disposed over at least a portion of the at least one deep trench capacitor and doped regions arranged on adjacent sides of the gate and separated from the gate by an insulating layer.

6 Claims, 14 Drawing Sheets

METHODS OF MAKING A TRENCH STORAGE DRAM CELL INCLUDING A STEP TRANSFER DEVICE This application is a divisional of application Ser. No. 09/014,523, filed Jan. 28, 1998, now U.S. Pat. No. 5,831,301.

FIELD OF THE INVENTION

The invention relates to semiconductor memory devices including dynamic random access memory (DRAM) devices. In particular, the invention relates to a new DRAM device structure and methods for making the DRAM device.

BACKGROUND OF THE INVENTION

The development of large monolithic dynamic random access memories has run into many problems. For example, one major problem involves shrinking the DRAM cell size without degrading retention time of the stored charge in order to pack more cells on a chip.

Large DRAMs are silicon based. Each DRAM cell typically includes a single MOS field effect transistor, a charge transfer device, with one of its source/drain diffusions connected to a storage capacitor. The other of the source/drain diffusions of the MOSFET typically is connected to a bit line. The gate typically is connected to a word line.

The DRAM cell operates by storing a charge on the capacitor for a logic 1 and not storing any charge for a logic 0. To maintain stable circuit operation the capacitance must be large enough and the charge transfer device must retain the stored charge, to yield a sufficient signal to noise ratio.

As DRAM cells are scaled to meet a chip size requirement for 1 G bit and generations beyond, the channel length of a transfer device on the substrate surface can no longer be scaled without degrading sub-threshold leakage requirements or retention time requirements.

SUMMARY OF THE INVENTION

The present invention provides a memory cell that overcomes the above-described problems by integrating a step transfer device next to a deep trench capacitor. The memory cell of the present invention is about 30% smaller than similar known memory devices without experiencing degradation due to short channel effects of the transfer device.

Accordingly, aspects of the present invention provide a memory cell that includes a substrate, a deep trench capacitor in the substrate, an FET in the substrate disposed over at least a portion of the deep trench capacitor. The FET includes a gate disposed over at least a portion of the deep trench capacitor and diffusions, or doped regions, arranged on adjacent sides of the gate and separated from the gate by an insulating layer. An isolation region in the substrate surrounds the FET and has a greater depth than the FET.

Other aspects of the present invention provide methods for forming such a memory cell.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

DETAILED DESCRIPTION OF THE INVENTION

The present invention provides a device structure including a step transfer gate and a sub-lithographic self-aligned trench/trench isolation. The device structure of the present invention reduces subthreshold device leakage by using a step transfer gate structure. Additionally, the self-aligned trench isolation of the present invention also permits reduced cell size.

The present invention provides the above structure without any decrease in device performance. The present invention also permits increasing channel length for a given gate dimension on the substrate surface, thereby also reducing sub-threshold leakage. Another advantage of the memory cell structure of the present invention is that it may be evolved into the next generation size, with a fully vertical transfer device, as three-dimensional process control is perfected.

Figure 1:
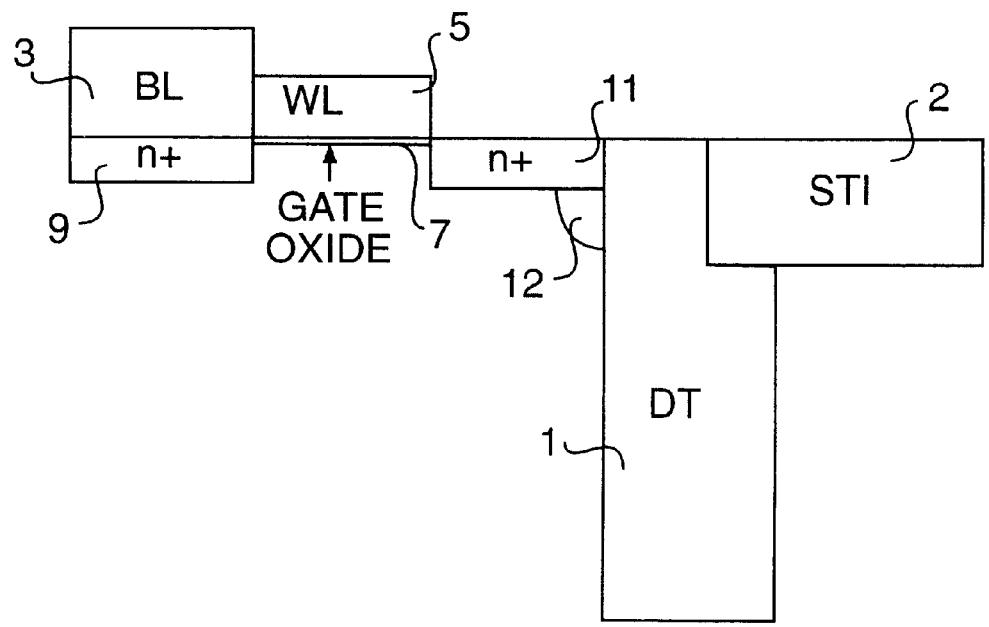
FIG. 1 represents a cross sectional view of a prior art DRAM cell.

FIG. 1 shows a known Merged Isolation and Node Trench cell (MINT) including a planar transfer device. The device shown in FIG. 1 includes a deep trench capacitor 1, a shallow trench isolation region 2, a bit line contact 3, a word line 5, or transfer device gate, gate oxide 7, and n+ source/drain regions 9 and 11. Buried strap 12 connects the deep trench capacitor storage node 1 to the source/drain diffusion 11 of the transfer device.

Figure 2:
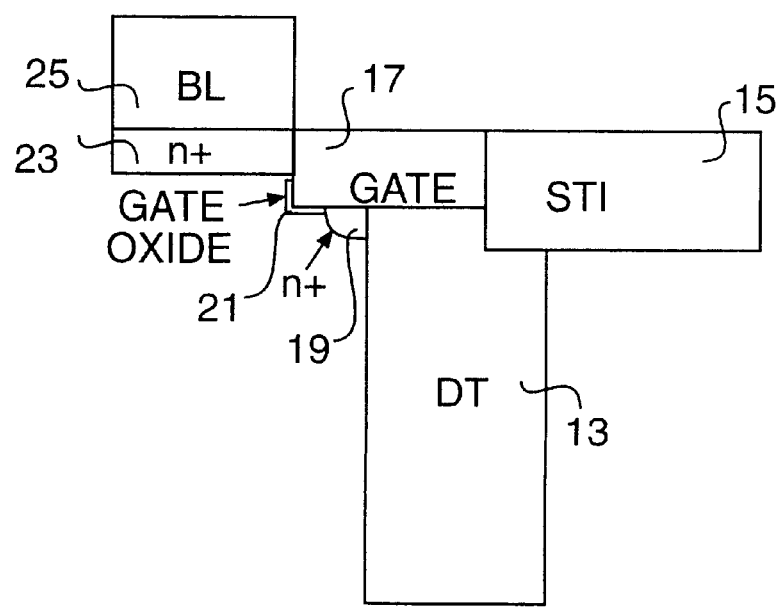
FIG. 2 represents a cross sectional view of an embodiment of a DRAM cell according to the present invention.

FIG. 2 shows an embodiment of a DRAM cell according to the present invention. As can be seen when comparing FIG. 1 and FIG. 2, a DRAM cell according to the present invention is much more compact than a DRAM cell according to the prior art. Of course, one of the major motivating factors in design of components in the semiconductor industry is reducing the size of memory cells so as to increase the number of memory cells that may be placed in one chip and to decrease the size of whatever device includes the smaller device structure. The present invention follows this motivating factor.

The embodiment of the DRAM cell according to the present invention, shown in FIG. 2, includes deep trench capacitor 13, isolation region 15, transfer device gate 17, buried strap 19, gate oxide 21, n+ diffusion area 23, and bit line contact 25. As can be seen in FIG. 2, the isolation region 15 is formed at least partially over the deep trench capacitor 13. Additionally, the gate oxide 21 is formed in an "L" shape.

In the embodiment of the DRAM cell shown in FIG. 2, the transfer device is built next to a deep trench capacitor 13. Forming the transfer device gate, at least partially over the deep trench capacitor contributes to the reduced size of the DRAM cell. In the embodiment shown in FIG. 2, about half of the gate width is formed over the deep trench capacitor. Also contributing to the decreased width of the DRAM cell is the buried strap 19, or n+ diffusion, formed under the gate 17.

The structure of the cell shown in FIG. 2 may be further reduced in size by utilizing a sub-minimum dimension for the deep trench capacitor opening and recovering the node capacitance by creating a bottle-shaped trench node underneath.

Figure 8:
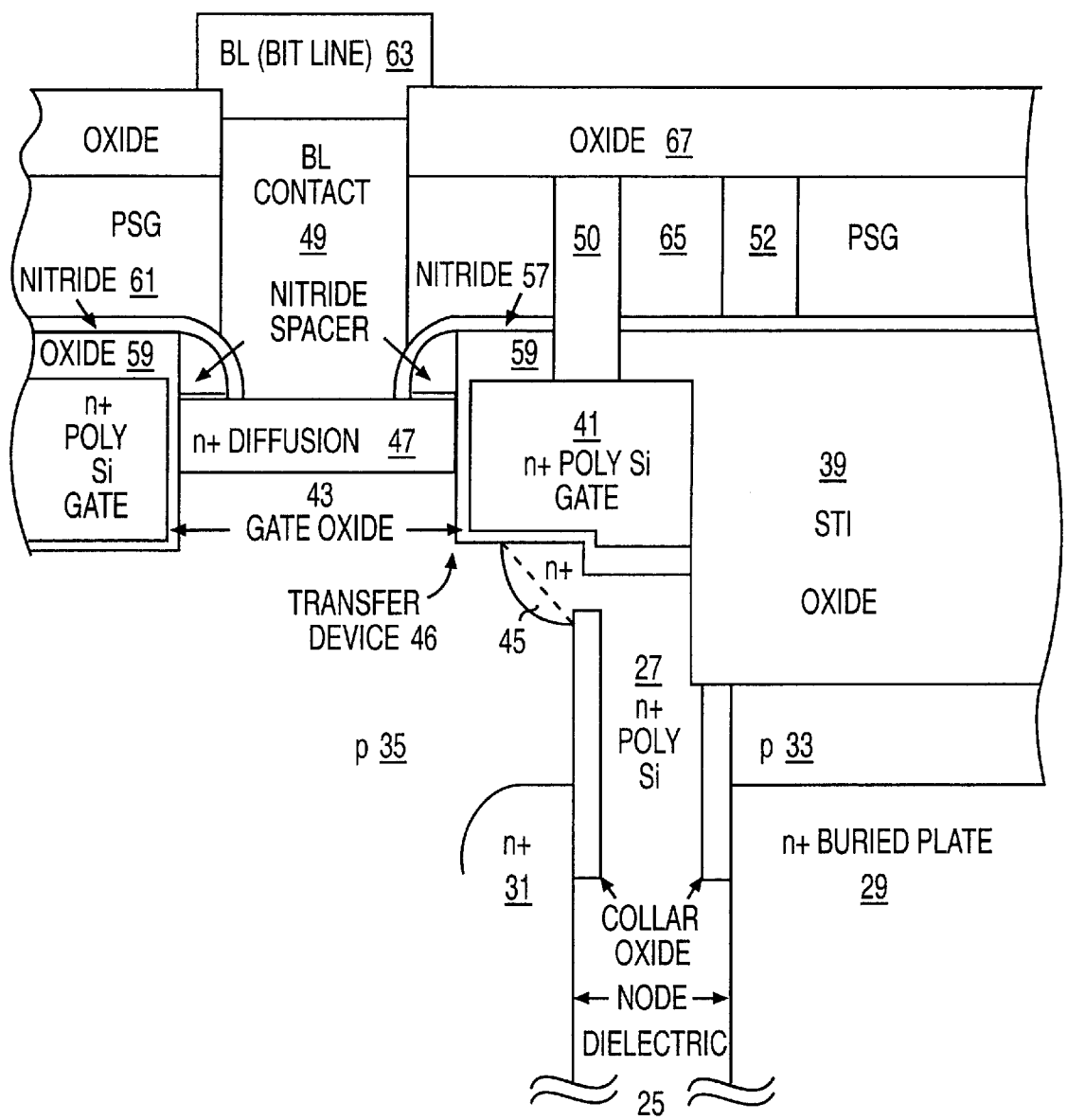
Figure 16:
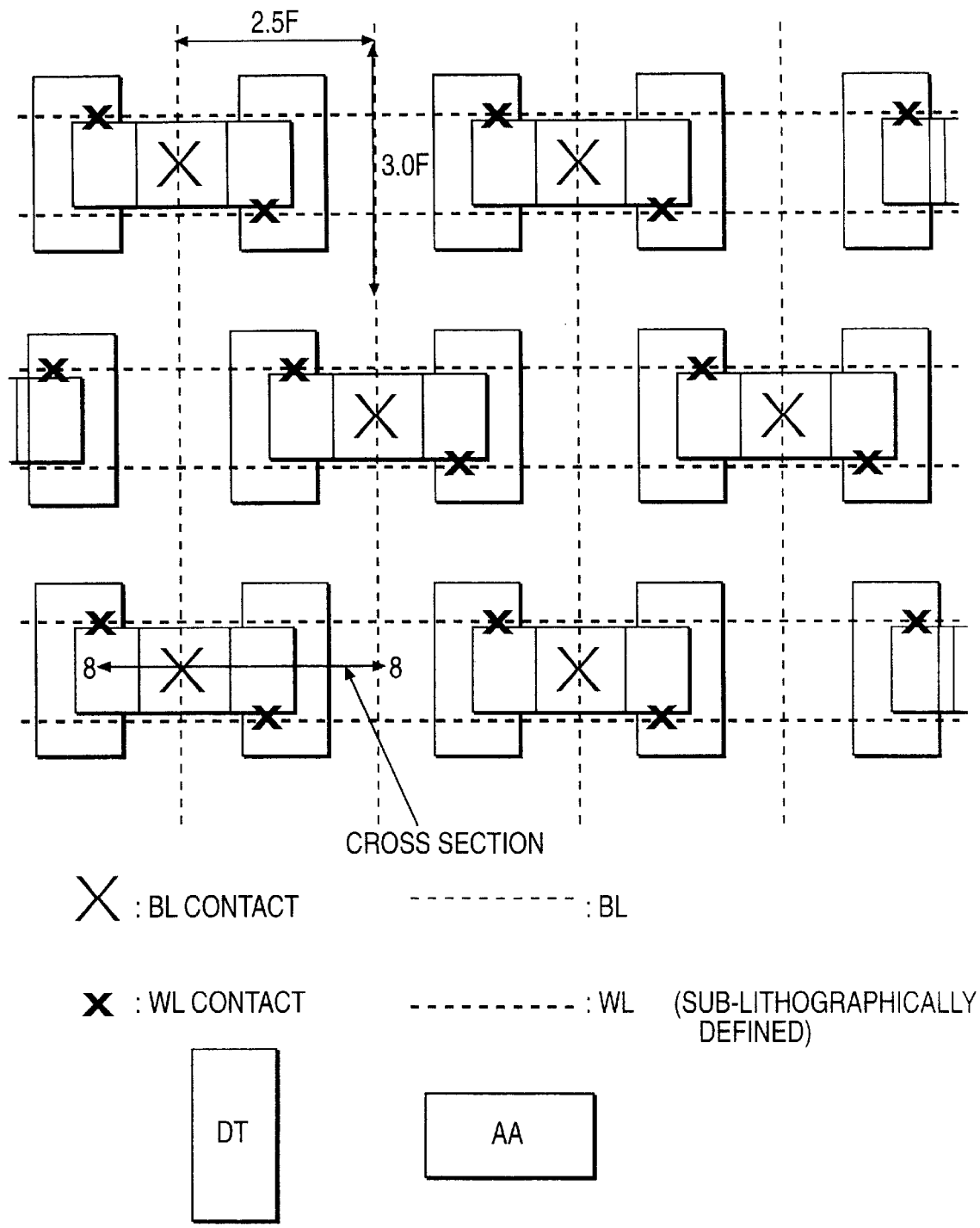
FIG. 16 represents an overhead view of the embodiment of a DRAM cell according to the present invention shown in FIG. 8 including a folded bit line.
Figure 17:
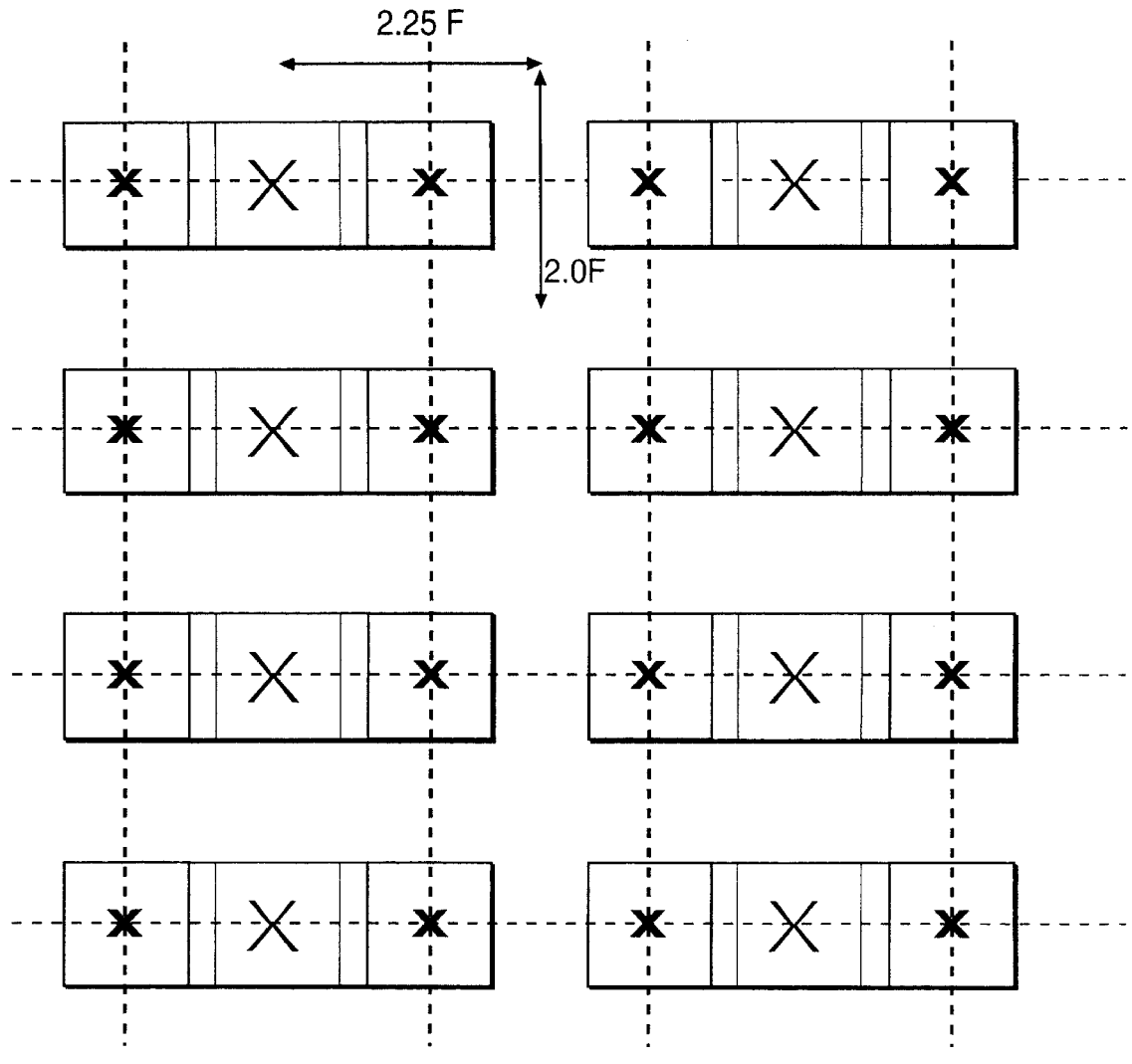
FIG. 17 represents an overhead view of the embodiment of a DRAM cell according to the present invention shown in FIG. 8 including an open bit line.

FIG. 8, FIG. 16 and FIG. 17 illustrate more detailed views of embodiments of DRAM cells according to the present invention from various perspectives. FIG. 8 illustrates a cross-sectional view of the cell layout along line 8—8 shown in FIG. 16. The cell layouts shown in FIG. 16 and FIG. 17 are two examples of a cell layout that can be constructed utilizing the embodiment shown in FIG. 8.

The embodiment of the present invention shown in FIG. 8 includes deep trench capacitor 27 with node dielectric 25 formed on the side wall. N+ regions 29 and 31 may be formed in the substrate adjacent a deep trench capacitor for the buried storage plate. Above n+ region 29 and 31 in the substrate may be arranged p doped regions 33 and 35.

Arranged around the boundary of the upper portion of the deep trench capacitor and the substrate may be a collar oxide 37. The collar oxide 37 may be formed to suppress the parasitic device leakage between the buried plate 29, 31 and the buried strap 45. The deep trench itself may be filled with n+ doped polycrystalline silicon.

Above p region 33 and at least partially over deep trench capacitor 27 may be provided shallow trench isolation (STI) region 39. The transfer device gate 41 may be arranged over the remaining portion of deep trench capacitor 27. Two facing active device areas may be surrounded by the STI as shown in the FIG. 16.

Three sides of the transfer device gate 41 may abut isolation region 39. The transfer device gate 41 may be made of n+ polycrystalline silicon. A layer of gate oxide 43 may be arranged at the boundary between the transfer device gate 41 and the p type substrate region 35.

As in the embodiment shown in FIG. 2, the embodiment shown in FIG. 8 may include an L-shaped gate oxide 43. The corner of L-shaped gate oxide 43 may be rounded or square. The embodiment of the DRAM cell according to the present invention shown in FIG. 8 may also include a buried n+ diffusion strap 45 connecting the storage node located inside of deep trench capacitor 27 to the source/drain diffusion of transfer device 46. Such strap is typical of known trench DRAM cells that include a self-aligned buried strap (BEST). For example, see Nesbit et al., A 0.6 $\mu m^2$ 256 Mb Trench DRAM Cell With Self-Aligned BuriEd STrap (BEST), IEEE (1993), the entire contents of which are hereby incorporated by reference.

The buried n+ diffusion strap 45 may be formed under the transfer device gate 41. The other source/drain diffusion region, bitline diffusion 47, of transfer device 46 may be located adjacent the transfer device gate 41. The transfer device gate may be connected to word line conductor as shown in FIG. 16 through word line contacts 50 (active word line) and 52 (passing word line) formed in oxide 59 and nitride 57 above transfer device gate 41.

Dielectric material 65 may fill the space between the word lines. One example of a dielectric material that may be utilized in this location is phosphorous doped glass (PSG). Another dielectric material 67 may cover the top of the word line. An example of a dielectric material that may be utilized in this location is undoped glass. Of course, many dielectric materials are known and could be utilized in either of these locations. Those skilled in the art could determine dielectric materials that could be utilized in these locations without undue experimentation once aware of the disclosure herein.

A bit line contact 49 may connect the source/drain diffusion 47 of the transfer device 46 to the bit line 63 running over dielectric layer 67. The bit line contact may be provided over the n+ diffusion region 47. Nitride spacers 51, 53 and nitride layers 57, 61 may be provided to form a bit line contact 49 borderless to transfer device gate 41.

FIG. 16 illustrates an overhead view of a memory cell according to the present invention. In the embodiment shown in FIG. 16, the wordline conductor may be formed using a sub-lithographic patterned technique, such as spacer wordline or hybrid resist photolithography to produce the folded bit line cell. Alternatively, utilizing the embodiment of the memory cell shown in FIG. 8, an open bit line cell, as shown in FIG. 17, may also be built with a word line defined by a normal lithographic technique.

Figure 15:
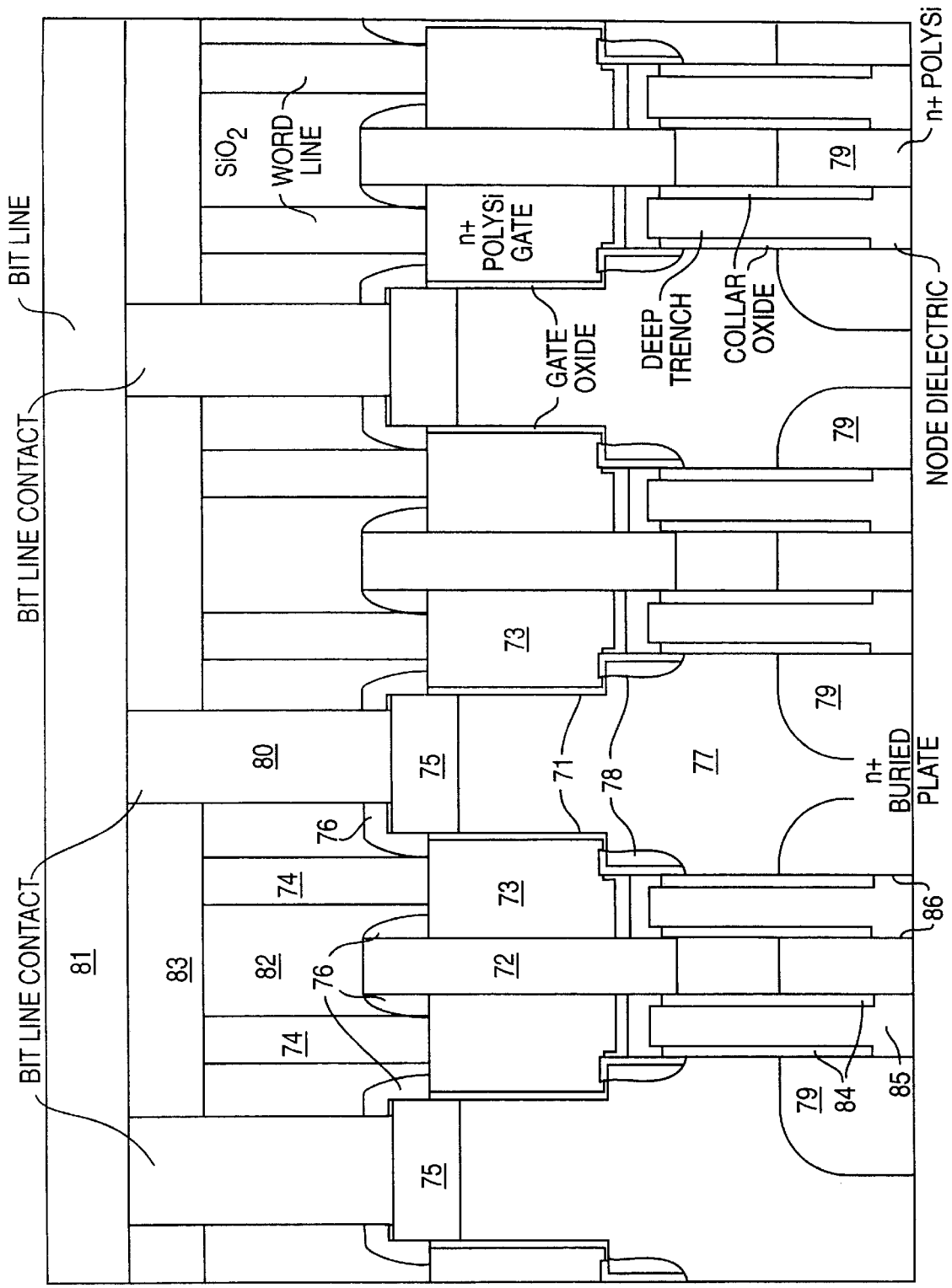
Figure 18:
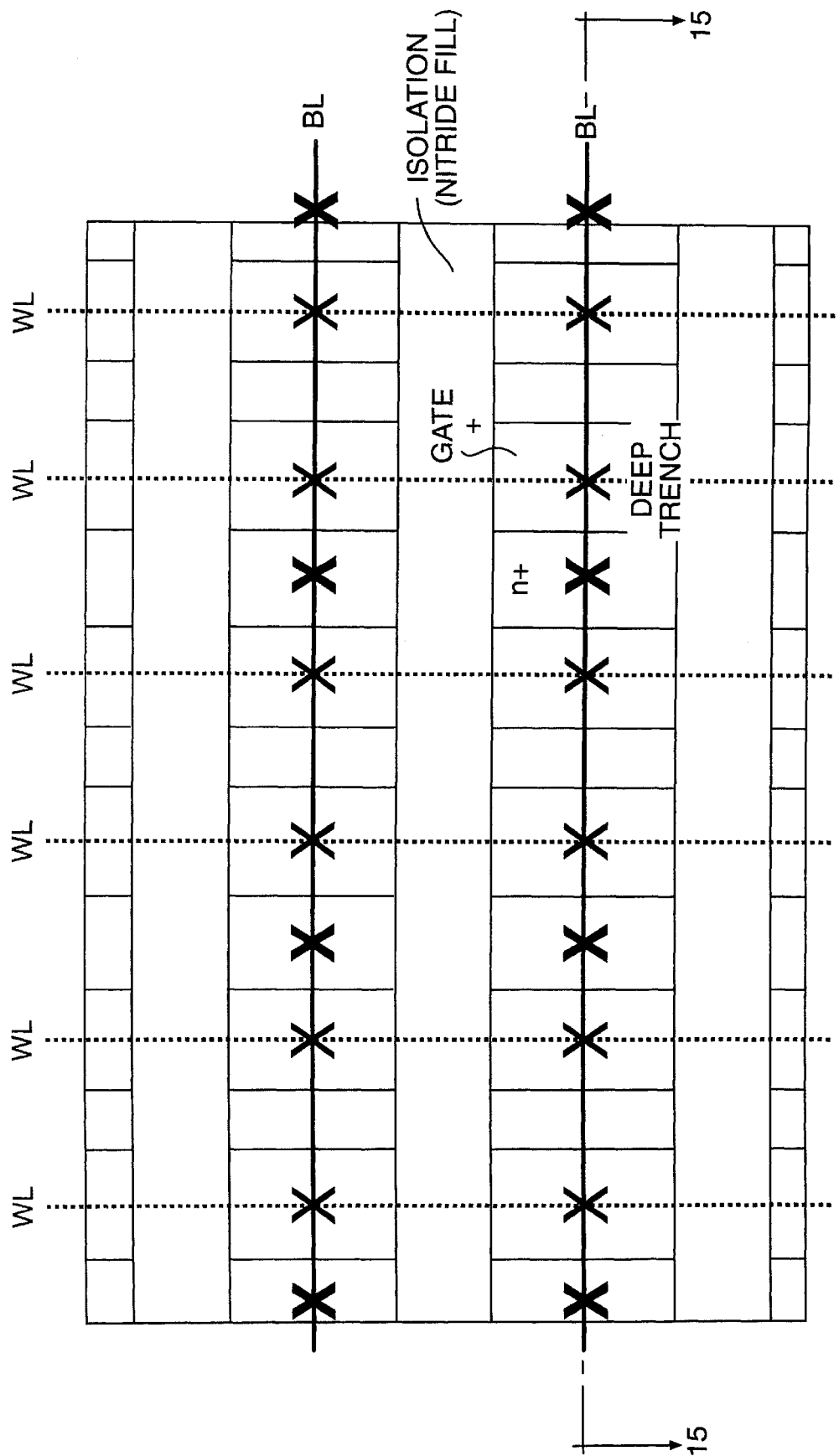
FIG. 18 represents an overhead view of the embodiment of a DRAM cell according to the present invention shown in FIG. 15.

FIG. 15 together with FIG. 18 shows another detailed embodiment of a DRAM cell according to the present invention. FIG. 15 represents a cross-sectional view of the cell layout along the line 15—15 in the view shown in FIG. 18.

The embodiment shown in FIGS. 15 and 18 includes gates 73. The gates may be made of n+ poly silicon. Gate oxide 71 may be provided adjacent a side between gates 73 and substrate 77 and the bottom surface of gates 73 between gates 73 and substrate 77. Gate isolation insulators 72 may be provided between gates 73 on the side of the gates opposite gate oxide 71. The gate isolation insulator 72 may be made of nitride and be self-aligned to the deep trench capacitor.

Extending above gates 73 as shown in FIG. 15 may be word line conductors 74. Word line conductors 74 may be made of W or $WSi_x$. The space between word lines 74 and the space between word lines and bit line contact 80 may be filled by insulating material 82. Any suitable insulating material may be used as the insulating material 82.

Word line 74 and insulting material 82 may be covered by insulator 83. Any suitable insulating material may be used as the insulating material 83.

In regions between gates 73, n+ diffusions 75 may be formed on the substrate 77. The substrate may be a typical p-type silicon substrate. Nitride spacers 76 may be arranged adjacent gate isolation insulators 72 and over a portion of gates 73. Nitride spacers 76 may also extend at least partially on top of n+ diffusions 75. There may be a thin layer of oxide between spacers 76 and the top surface of n+ diffusions 75.

Bit line contact 80 may be formed over n+ diffusion 75 for providing connection between a bit line 81, n+ diffusion, and, ultimately, the DRAM cell.

The embodiment of the memory cell shown in FIG. 15 according to the present invention may also include n+ buried strap 78. Such strap is typical of known trench DRAM cells that include a self-aligned buried strap (BEST). For example, see Nesbit et al., A 0.6 $\mu m^2$ 256 Mb Trench DRAM Cell With Self-Aligned BuriEd STrap (BEST), IEEE (1993). Buried strap 78 may be arranged under a portion of gate 73 and underlying gate oxide layer 71. Additionally, buried strap 78 may extend downwardly as shown in FIG. 15 to contact collar oxide 84 surrounding the deep trench as described below in greater detail.

As shown in FIG. 15, this embodiment of the DRAM cell according to the present invention may include n+ buried storage node plate 79. The n+ buried storage node plate may be formed in the substrate 77 adjacent sides of the deep trenches.

As stated above, buried plate may be formed adjacent sides of the deep trenches. The deep trenches include n+ poly silicon fill 85. Collar oxide 84 may surround the n+ poly silicon fill 85. In the embodiment shown in FIG. 15, collar oxide 84 extends from above the deepest extent of n+ buried strap 78 to below the top of the buried plate 79.

The DRAM cell shown in FIG. 15 may include node dielectric 86 surrounding the n+ poly silicon fill 85. The node dielectric may be arranged between n+ polycrystalline silicon fill and the substrate 77, below collar oxide 84.

As shown in FIG. 15, bit line 81 may overlie the bit line contacts 80 and insulating material 83.

A memory cell according to the present invention preferably includes at least a substrate, a deep trench capacitor in the substrate, an FET in the substrate disposed over at least a portion of the deep trench capacitor, and adjacent an isolation region. The FET may include a gate disposed over at least a portion of the deep trench capacitor and diffusions arranged on adjacent sides of the gate and separated from the gate by an insulating layer. The isolation region may be located in the substrate surrounding the FET and has a greater depth than the FET.

The isolation region will be disposed over a portion of the deep trench capacitor not covered by the FET. Additionally, the sides of the gate of the FET that diffusions are arranged adjacent to may intersect to form a corner. The corner may extend into the substrate between the diffusions. Furthermore, one of the diffusions may be arranged adjacent to the gate, which is connected to the bit line through the bit line contact.

The memory cell according to the present invention may also include a diffused strap connecting the deep trench storage node to one of the source/drain diffusions of the transfer FET device.

In an embodiment in which the sides of the gate of the FET that diffusions are arranged adjacent to intersect to form a corner, one diffusion may be arranged adjacent to the deep trench capacitor at a location substantially corresponding to the intersection of the sides of the gate of the FET.

Still further, in an embodiment of a memory cell according to the present invention in which the isolation region is disposed over a portion of the deep trench capacitor not covered by the FET, one of the diffusions of the FET may be arranged adjacent to the deep trench and connected to the deep trench capacitor storage node by a diffused strap. In such an embodiment, the isolation region may be formed in a substrate to a greater depth than the diffused strap.

As discussed above, the present invention also includes a method of forming a memory cell such as the embodiments described above. FIGS. 3–8 illustrate various stages of an embodiment of a method according to the present invention for forming a memory cell. Of course, other methods could be used to form the structure shown in FIGS. 2, 8, and 15.

The method shown in FIGS. 3–8 begins by providing a p-type substrate, such as a silicon substrate 110. Materials may first be deposited upon an upper surface of the substrate. For example, standard pad oxide 112, pad nitride 114, and oxide layer 116 may be formed on the surface of the substrate 110. The oxide layer 116 may be formed through chemical vapor deposition. The materials deposited upon substrate 110 may be utilized as a mask for forming deep trench 136.

After providing the substrate and depositing any materials on top of the substrate, a deep trench capacitor opening 118 may be formed in the substrate. The opening 118 may be an oversized opening, such as that shown in FIG. 3. The depth of the deep trench capacitor opening may vary, depending upon the structure being formed. In one embodiment of the method, the deep trench capacitor opening 118 is formed from about 0.2 $\mu$m to about 0.3 $\mu$m deep.

After forming the deep trench opening 118, a thin oxide film 120 may be grown on exposed portions of the substrate. A variety of methods may be utilized to form the thin oxide film. For example, the thin oxide film may be thermally grown. The thickness of the thin oxide film may also vary. According to one embodiment, the thin oxide film was about 5 nm or less.

Figure 3:
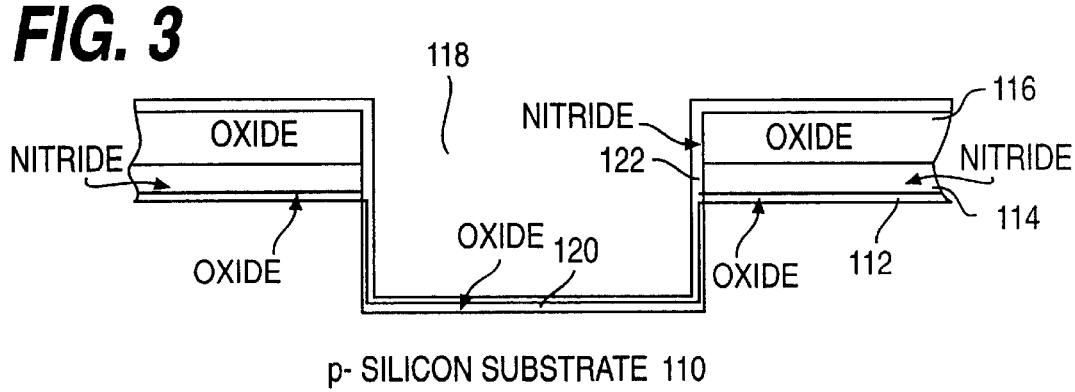
FIGS. 3–8 represent cross sectional views of various stages of an embodiment of the process for forming a DRAM cell according to the present invention.

After laying down the thin oxide film, a layer of nitride 122 may be deposited on the thin oxide film, and exposed surfaces of the substrate or any materials deposited upon the substrate. For example, as shown in FIG. 3, nitride layer 122 may be deposited upon thin oxide film 120 and exposed portions of oxide layer 112, nitride layer 114, and oxide layer 116. A variety of methods may be utilized for forming the nitride layer. In one example, chemical vapor deposition was utilized to form the nitride layer 122. Additionally, the thickness of the nitride layer may vary. According to one example, the nitride layer was 10 nm or less.

Proceeding on in the method, oxide may be deposited in the deep trench capacitor opening 118. The oxide may be about 0.1 $\mu$m thick. The oxide may then be etched to form spacers 124 and 126. The size of the opening 118 and, hence, the size of the spacers 124 and 126 formed in the opening serve to determine the location of the transfer device gate with respect to the location of the deep trench and the buried strap. Formation of an opening, and hence the spacers of a corresponding size may be utilized to automatically create the correct positioning of the deep trench relative to the above-referenced structures, making the other structures self-aligning.

Utilizing the spacers as a mask, the deep trench may be further etched. At this stage, the deep trench may be partially etched to an appropriate depth. According to one embodiment, at the deep trench may be partially etched to a depth of from about 0.8 $\mu$m to about 1 $\mu$m.

Figure 4:
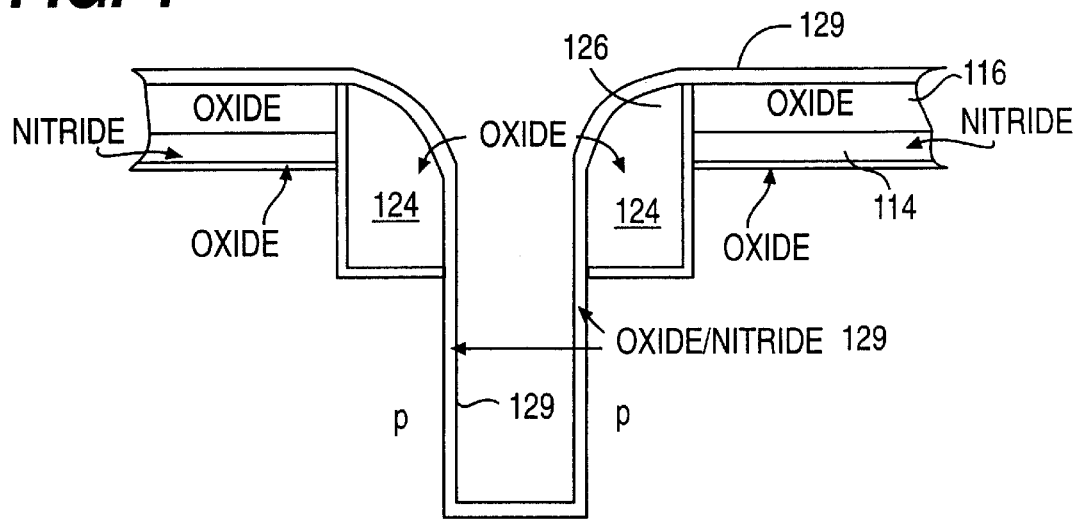

The surface of the deep trench, spacers, and other exposed surfaces may then be covered by CVD oxide and CVD nitride. The composite oxide and nitride liner 129 may be used as a doping mask during formation of the buried plate 79. The resulting structure is shown in FIG. 4.

After deposition of the nitride, the deep trench may be further etched.

After completing etching of the deep trench, n+ buried capacitor plates 130 and 132 may be formed in the substrate. The buried capacitor plates may be formed by filling the deep trench 136 with arsenic doped glass (ASG) and diffusing arsenic into the substrate from the trench walls not covered by the oxide/nitride liner 129. Node dielectric may then be formed after removing the ASG.

The deep trench 136 may then be filled with a first layer of n+ doped polycrystalline silicon. The polycrystalline silicon may be recessed to a first level. Next, collar oxide 134 may be deposited and etched.

A second layer of n+ doped polysilicon may be deposited over the first layer of n+ polysilicon and recessed to a second level below the oxide spacer 124 around the oversized trench top. A portion of the exposed collar oxide and node dielectric may then be removed, creating an opening for the buried strap 142. Thin damage preventing layer 129 may also be removed during the node dielectric strip.

Figure 5:
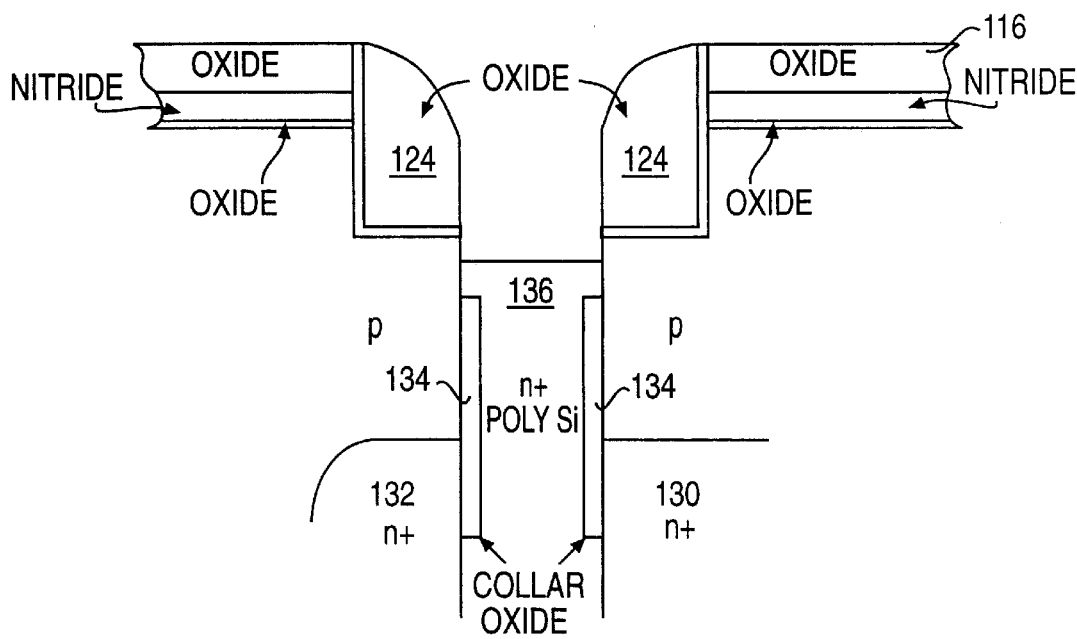

A third layer of polycrystalline silicon may then be deposited and recessed to the level shown in FIG. 5. N+ dopant may be diffused out of the opening by thermal cycles during the subsequent process steps to form a buried strap 142.

Next in the process, transfer device gate may be formed at the top portion of deep trench 136.

After oxide 124, 116 nitride 122 and oxide 120 are stripped, sacrificial oxide may be grown over the exposed silicon substrate and polycrystalline silicon surface. The sacrificial oxide may then be etched. This is to remove any silicon surface damage before growing the gate oxide. If necessary, a device channel region may be implanted before removing the sacrificial oxide.

After stripping the sacrificial oxide, gate oxide 143 may be grown over the exposed substrate, which typically is silicon. Thicker oxide may be grown over the doped polycrystalline silicon 136 during the gate oxidation.

Figure 6:
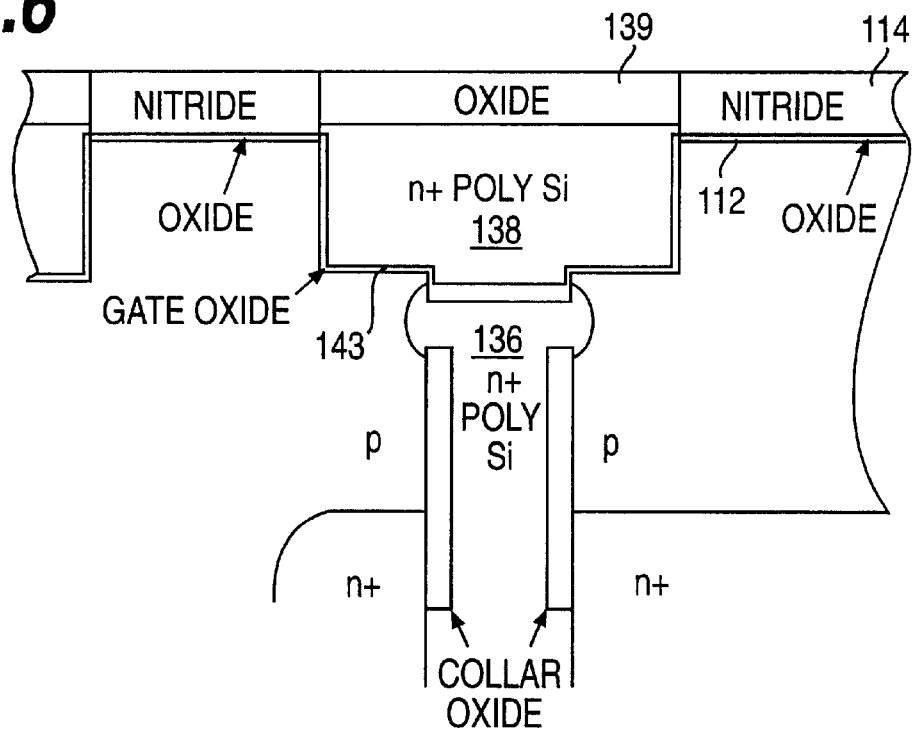

After gate oxide 143 formation, the open area over the deep trench may be filled with n+ doped polycrystalline silicon. The upper surface of the device may be planarized. The polysilicon may then be recessed. Any recess created may then be filled with $SiO_2$ 139. $SiO_2$ deposited in the recess may be deposited by chemical vapor deposition (CVD). After deposition, the $SiO_2$ may be planarized. The resulting structure is shown in FIG. 6.

Figure 7:
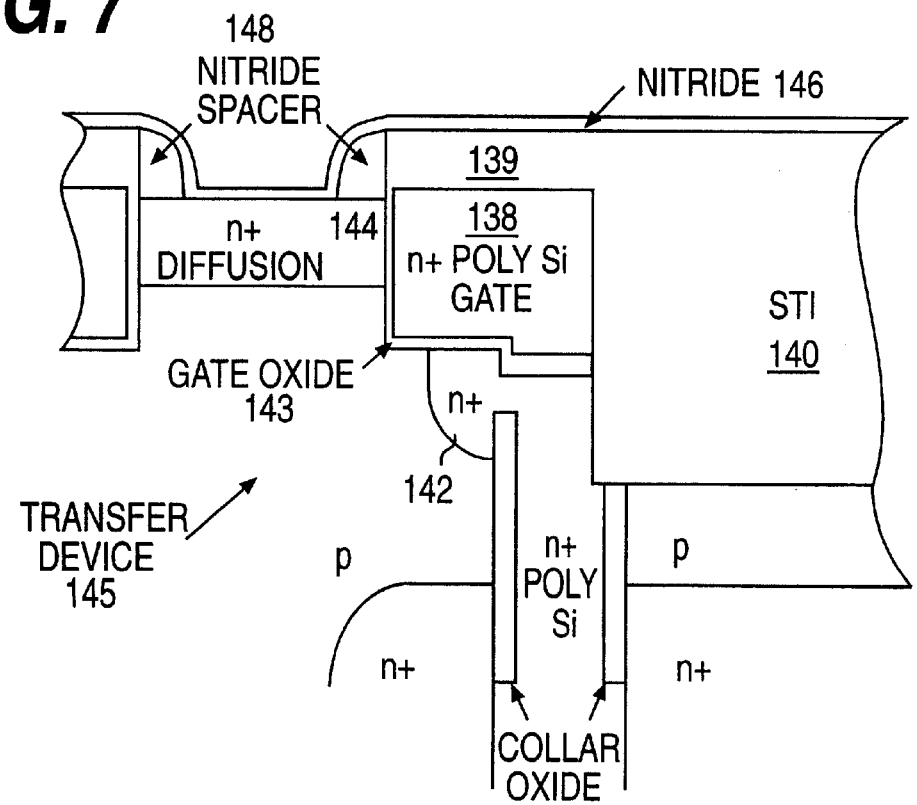

The next step according to this embodiment of the process, involves forming an isolation region 140 in the device. An embodiment of the isolation region is shown in FIG. 7. The isolation region may be a shallow trench isolation (STI) region. Additionally, the isolation region may be filled by CVD of $SiO_2$ and planarized. Of course, other methods and materials may be utilized to form an isolation region in the device. Those skilled in the art would be able to substitute other materials and methods for forming an isolation region in the device without undue experimentation.

As shown in FIG. 7, the isolation region 140 may, at least partially, overlap deep trench 136. Preferably, the isolation region extends deeper into the substrate than buried diffusion strap 142. The buried diffusion strap 142 is formed by out-diffusion of n-type dopant from trench fill polycrystalline silicon 136 during the gate oxide formation and STI process. By forming the isolation region so that it extends deeper into the substrate than the buried diffusion strap may help to isolate the buried strap in one cell from the buried strap in the adjacent cell. The buried strap n+ diffusion becomes the source/drain diffusion of the transfer device 145. After planarization of the device, nitride layer 114 shown in FIG. 6 may be removed and the exposed silicon substrate may be doped by ion implantation to form the other n+ source/drain diffusion 144 of the transfer device 145.

After the source/drain formation of transfer device, the array area may be covered by a layer of nitride (not shown) and process steps to form support circuit CMOS devices may be carried out. Detailed descriptions of support circuit CMOS device formation are omitted here, but those skilled in the art would be able to integrate process steps to form support circuit devices without undue experimentation.

After the process steps to form the support circuit CMOS devices, the nitride layer may be removed from the array area and oxide 112 is etched. Nitride layer may then be deposited and etched to form the spacer 148 at the perimeter of n+ diffusion 144. After the spacer formation, nitride 146 may be deposited. The nitride spacer 144 and nitride layer 146 over polysilicon gate region 138 may be formed to make a bit line contact borderless to the gate later in the process. The resulting structure is shown in FIG. 7.

In the next step, insulating material such as phosphorous doped glass (PSG) 65 may be deposited. A wordline trench may then be etched into PSG 65 to the top of nitride 57 and 61 with photoresist covering non-word line area. While photoresist covers the non-word-line contact area, nitride 57 and 61 and oxide 59 at the bottom of the word-line trench may be etched open to make a word-line contact to gate 41. Wordline trench and the contact hole may then be filled with conductor material, such as tungsten, and planarized. More CVD oxide may then be deposited and the bit-line contact 49 opened. Bit-line contact may then be filled with tungsten, n+ doped polycrystalline silicon or other suitable conductive material, and planarized. Finally, metal bit line 63 may be formed over the bit line contact 49. The resulting structure is shown in FIG. 8.

FIG. 16 and FIG. 17 illustrate two possible layouts that may be produced by the structure of the present invention. FIG. 16 is an embodiment of a layout for a 7.5 square folded bit line cell whose unit cell area is 2.5 feature lengths by 3feature lengths, that is, 7.5 square feature size. In order to construct the 7.5 square cell array shown in FIG. 16, sub-lithographic imaging techniques, such as spacer image transfer or hybrid photolithography, may be used to create a word line trench whose width is smaller than one feature length. FIG. 17 illustrates a layout for an embodiment of a 4.5 square, open bit line cell, whose unit cell area is 2.25 feature lengths by 2 feature length, that is, a 4.5 square feature size. The 7.5 square cell provides better noise immunity due to the folded bit line architecture, while the 4.5 square cell provides a density advantage.

Figure 9:
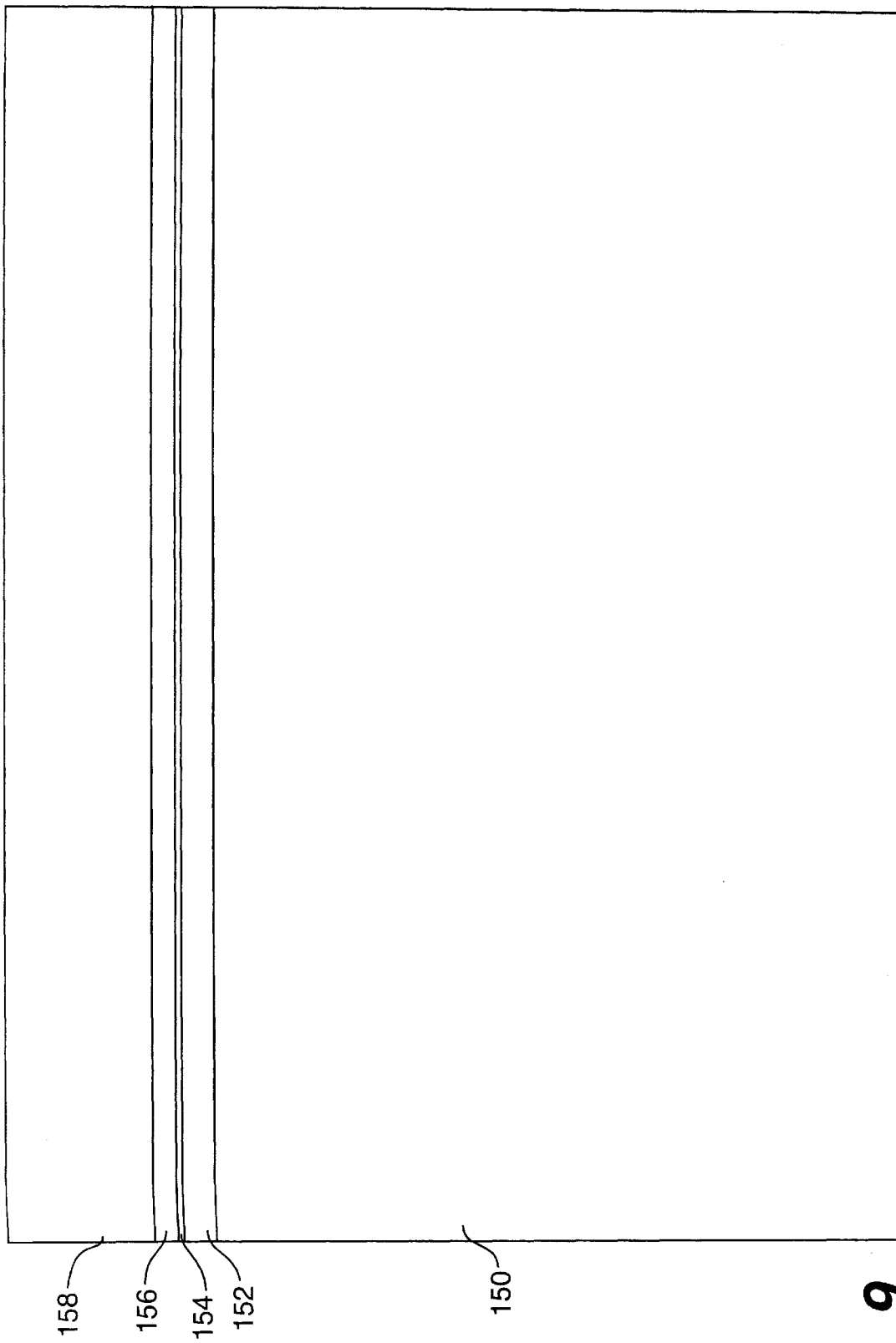
FIGS. 9–15 represent cross sectional views of various stages of another embodiment of the process according to the present invention for forming a DRAM cell according to the present invention.

FIGS. 9–15 illustrate various stages of another embodiment of a method for forming the DRAM cell according to the present invention. FIG. 9 shows the starting point of the process. The process begins by providing a silicon substrate 150. An n+ source/drain diffusion 152 may be formed in the substrate 150.

A layer of oxide 154 may be formed on n+ diffusion region 152 of the substrate. Nitride layer 156 may be deposited on oxide layer 154. Another layer of oxide 158 may then be formed on nitride layer 156. Oxide layer 158, nitride layer 156, and oxide layer 154 may be referred to as a "pad" structure.

Figure 10:
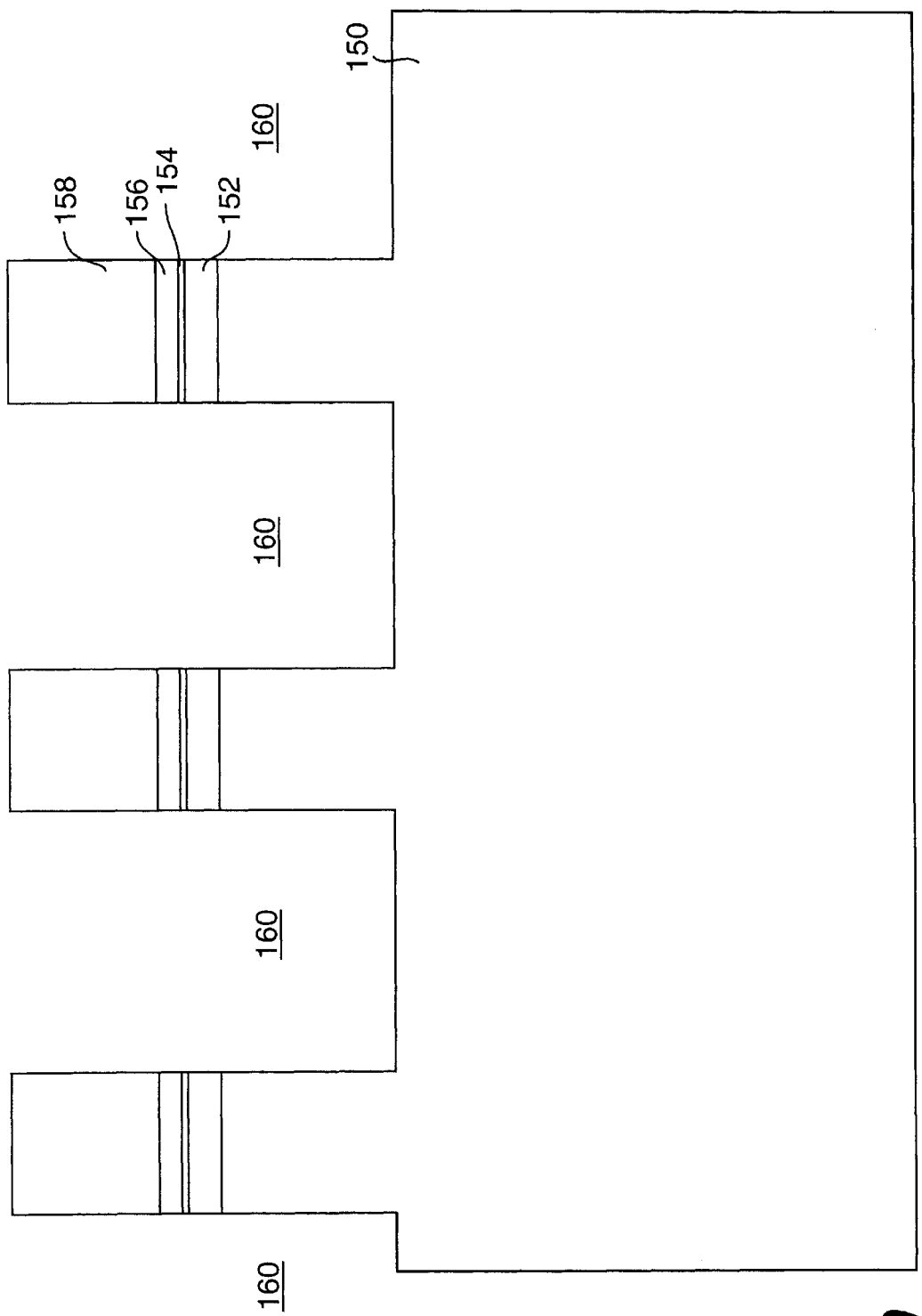

After formation of the structure shown in FIG. 9, the pad and substrate are etched to form the structure shown in FIG. 10. Etch depth of the trench 160 in the silicon may be a determinant of the vertical component of the transfer device.

After formation of trenches 160, oxide may be deposited in each of the depressions. The oxide may then be etched to result in oxide spacers 162 extending from the vertical walls of the trenches. These oxide spacers may determine the horizontal step dimension. In otherwords, the size of the spacers formed may serve to determine the location of the transfer device gate with respect to the location of the deep trench and the buried strap. Formation of an opening, and hence the spacers of a corresponding size may be utilized to automatically create the correct positioning of the deep trench relative to the above-referenced structures, making the other structures self-aligning.

After formation of oxide spacers, polysilicon may be deposited in the remaining portions of the trenches. The polysilicon may then be etched to form spacers 164 extending from the vertical surface of oxide spacers 162. The area of the polysilicon spacers 164 and the area of the substrate beneath the polysilicon spacers 164 may be the area where the deep trench will be formed.

Figure 11:
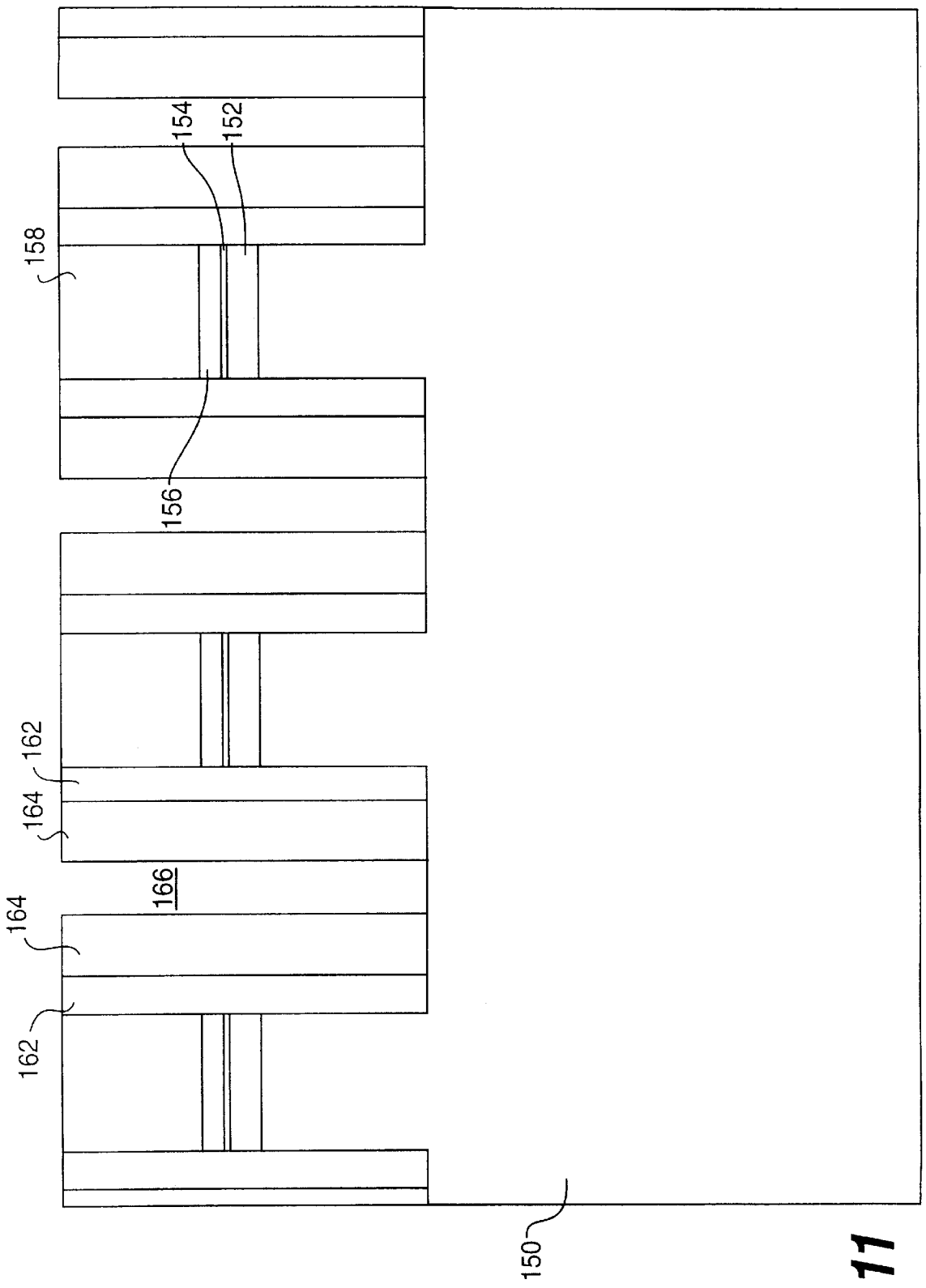

After formation of the spacers, the surface of the structure shown in FIG. 11 may be planarized with chemical-mechanical planarization (CMP).

Next, the silicon substrate may be etched utilizing the double spacers as a mask to form trench 166 for device isolation in one dimension. To form device isolation in the other direction (not shown in the cross sectional figures), the trench 166 may be filled to planarize the structure before applying photoresist. The trench may be filled with polymer. Then, orthogonal isolation lines to trench 166 may be patterned.

Figure 12:
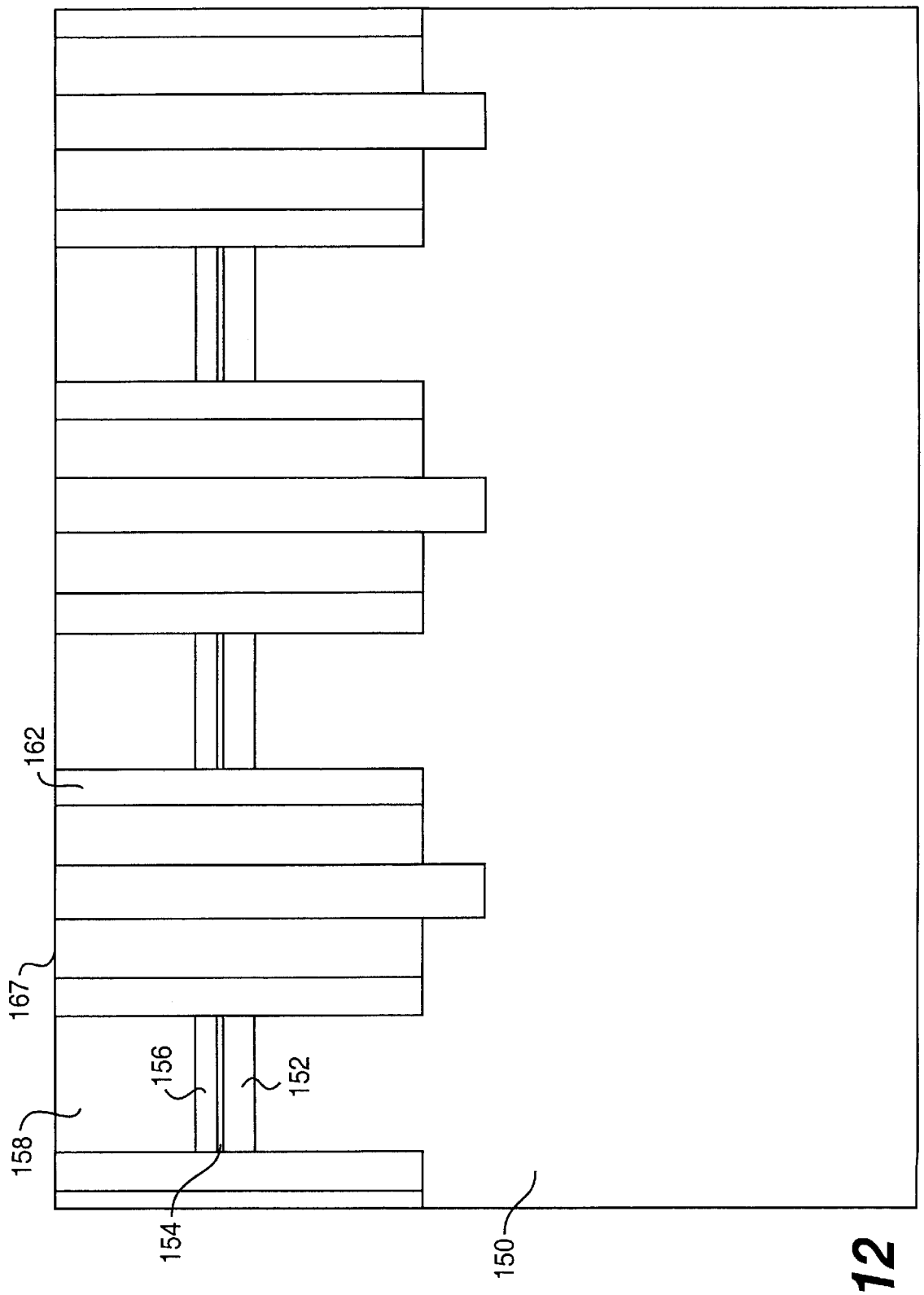

Subsequent to the patterning of the isolation lines, the pad structure 154, 156, and 158 and the silicon substrate may be etched to the same level as trench 166. After removing the photoresist and the polymer material, thin oxide may be grown over the exposed silicon substrate and polysilicon surface, and the trench may be filled with nitride and planarized. The resulting structure is shown in FIG. 12.

Figure 13:
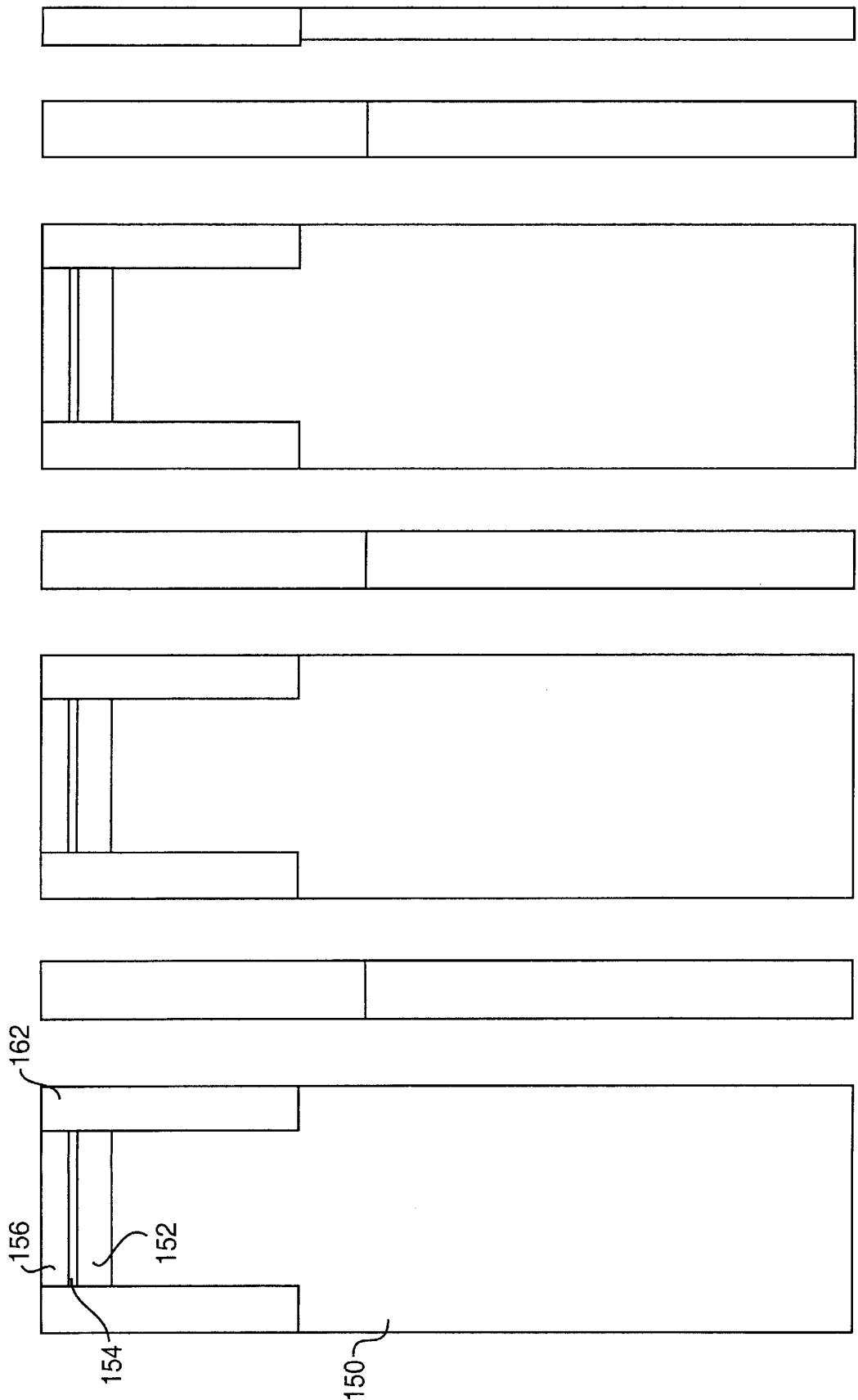
Figure 14:
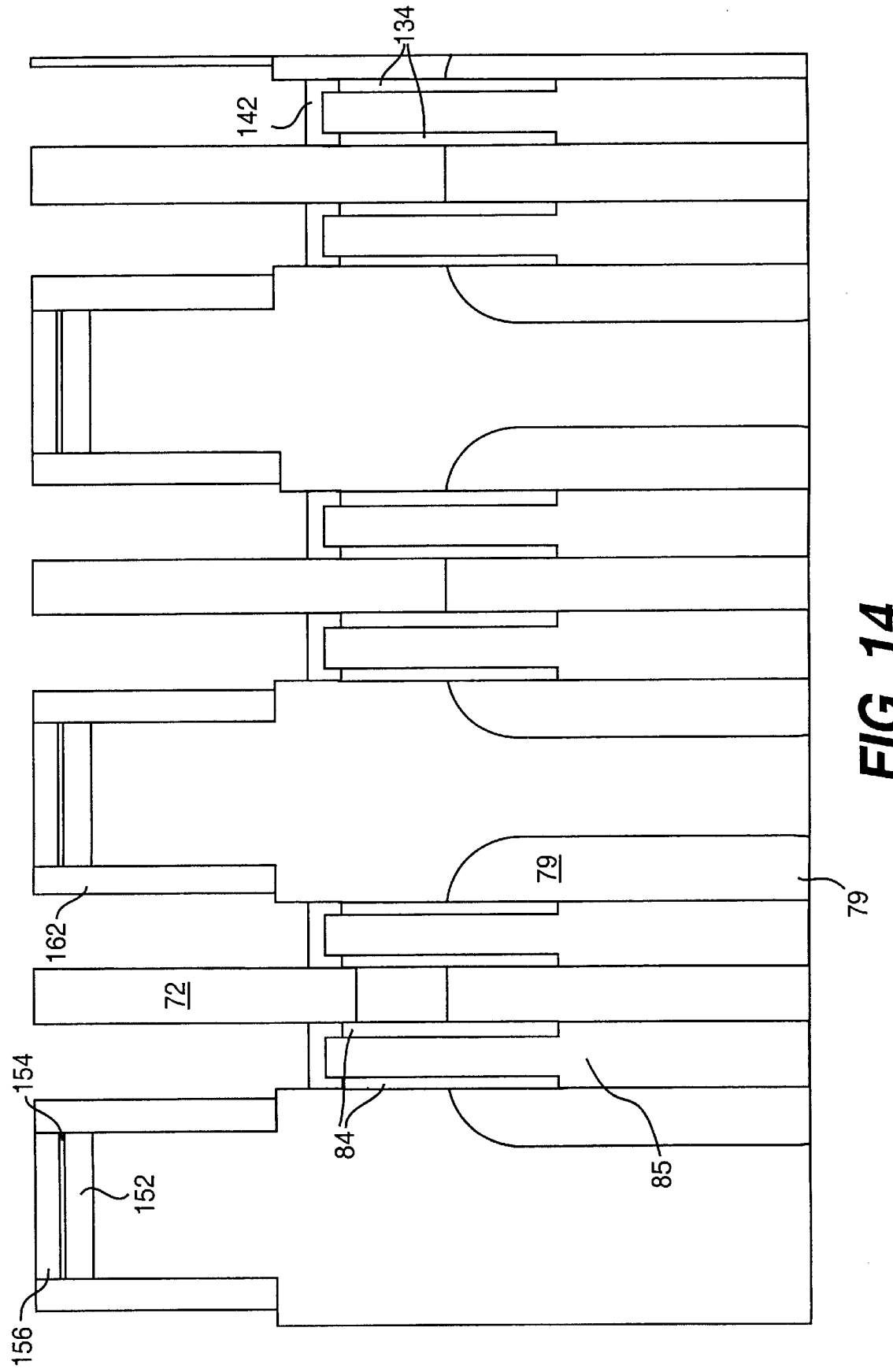

The next step in the process involves forming the trench storage node. The deep trench may be etched in a location where the polycrystalline silicon spacers 164 are located. The etching may be carried out using nitride region 168 and oxide 158 as a mask. The structure resulting from the etching of the polycrystalline silicon spacers 164 is shown in FIG. 13.

After completing of the deep trench, n+ buried capacitor plates 130 and 132 may be formed in the substrate. The buried plates 130 and 132 may be formed by filling the trench with arsenic doped glass (ASG). The ASG may then be recessed to an appropriate depth. Next, arsenic may diffuse into the substrate from the trench walls. Node dielectric may then be formed after removing the ASG.

After forming the node dielectric, a first layer of n+ doped polycrystalline silicon may be deposited to fill the trench. The wafer surface may then be planarized. The polycrystalline silicon may be recessed to a first level and collar oxide 134 formed.

A second layer of n+ doped polysilicon may then be deposited over the first polysilicon layer, planarized and recessed to a second level below the oxide spacer 162. The exposed collar oxide and node dielectric may then be removed, creating an opening for the buried strap 142. A third layer of polycrystalline silicon may then be deposited and recessed to the level shown in FIG. 14. N+ dopant may be diffused out of the opening by thermal cycles during the subsequent process steps to form a buried strap.

The next step in the process involves forming the transfer device gate. After oxide spacers 162 are removed, sacrificial oxide may be grown over the exposed silicon substrate and polycrystalline silicon surface and may then be etched. This is to remove any silicon surface damage before growing gate oxide.

If necessary, device channel region may be implanted before removing the sacrificial oxide. After stripping sacrificial oxide, gate oxide 71 may be grown over the exposed silicon substrate. Thicker oxide may be grown over the exposed doped polycrystalline silicon during the gate oxidation.

After gate oxide 71 formation, the open area over the deep trench may be filled with n+ doped polycrystalline silicon. The upper surface of the device may be planarized. The polysilicon may then be recessed. Nitride may then be deposited and etched to form spacers 76, shown in FIG. 15, around the perimeter of the polysilicon gate opening.

After formation of word line contact, word line, bit line contact and bit line may be formed, in a manner similar to that described above.

While both the method and device of the invention have been described in terms of two embodiments, those skilled in the art will recognize that many of the steps described above can be altered, deleted, and/or substituted and that dopant species and types as well as other material substitutions can be freely made without departing from the spirit and scope of the invention.

For example, the polarity of the structures could be altered. According to one embodiment, an n-type substrate could be utilized with p+ diffusions and p+ polysilicon.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for forming a memory cell, said process comprising the steps of:

providing a substrate;

forming at least one deep trench of a deep trench capacitor in the substrate;

forming at least one FET in the substrate disposed over at least a portion of the at least one deep trench;

forming a gate of the at least one FET disposed over at least a portion of the at least one deep trench;

forming doped regions of the at least one FET arranged on adjacent sides of the gate and separated from the gate by an insulating layer; and forming at least one isolation region in the substrate surrounding the at least one FET and having a greater depth than the at least one FET.

2. A process for forming a memory cell, according to claim 1, further comprising the steps of:

forming an opening in the substrate prior to forming the deep trench, said opening determining positioning of said gate of said FET relative to said deep trench;

depositing oxide in the opening; and forming oxide spacers the opening prior to forming said deep trench.

3. A process for forming a memory cell, said method comprising the steps of:

providing a substrate having at least one deep trench of a deep trench capacitor filled with n+ doped polycrystalline silicon, collar oxide arranged between portions of said n+ doped polycrystalline silicon filling said at least one deep trench and said substrate, node dielectric arranged beneath said collar oxide between portions of said n+ doped polycrystalline silicon filling said at least one deep trench and said substrate, and buried n+ capacitor plates formed therein;

creating at least one opening for at least one buried strap by removing a portion of the collar oxide and node dielectric;

diffusing dopant out of the at least one deep trench opening by thermal cycling to form a buried strap;

forming a gate oxide over exposed surfaces of the substrate;

filling an open area over said deep trench with n+ doped polycrystalline silicon;

planarizing an upper surface of the device;

forming at least one isolation region in the device at least partially overlapping said at least one deep trench and extending deeper than the at least one buried strap;

doping exposed silicon substrate to form an n+ source/drain diffusion of a transfer device of the memory cell;

forming at least one support circuit CMOS device;

forming at least one wordline trench and at least one contact hole and filling them with an electrically conducting material;

forming at least one bit-line contact and filling it with an electrically conductive material; and forming at least one bit line over the at least one bit line contact.

4. The process for forming a memory cell, according to claim 3, further comprising the steps of:

forming an opening in said substrate prior to forming said deep trench, said opening determining positioning of said gate of said FET relative to said deep trench;

depositing oxide in the opening; and forming at least one spacer in said opening;

etching said deep trench; and removing said spacer prior to forming said gate oxide.

5. A process for forming a memory cell, said process comprising the steps of:

providing a substrate having a pad structure including a first layer of oxide, a layer of nitride, and a second layer of oxide formed thereon; at least two deep trenches of deep trench capacitors filled with n+ doped polycrystalline silicon formed therein and having a depression above said n+ doped polycrystalline silicon; a collar oxide arranged between portions of each of said n+ doped polycrystalline silicon filling said deep trenches and said substrate; node dielectric arranged between portions of each of said n+ doped polycrystalline silicon filling said deep trenches and said substrate; and buried n+ capacitor plates formed therein;

removing exposed collar oxide and node dielectric to create an opening for a buried strap;

diffusing n+ dopant out of the deep trenches to form the buried strap;

forming a transfer device gate;

growing gate oxide over exposed portions of the substrate;

filling the depressions of the deep trenches with n+ doped polycrystalline silicon; and forming a word line contact, a word line, a bit line contact and a bit line.

6. The process for forming a memory cell, according to claim 5, further comprising the steps of:

forming an opening in said substrate prior to forming said deep trench, said opening determining positioning of said gate of said FET relative to said deep trench;

depositing oxide in the opening; and forming at least one spacer in said opening;

etching said deep trench; and removing said spacer prior to forming said gate oxide.

* * * * *